United States Patent
Wen et al.

(10) Patent No.: US 11,158,508 B2
(45) Date of Patent: *Oct. 26, 2021

(54) BARRIER LAYER ABOVE ANTI-PUNCH THROUGH (APT) IMPLANT REGION TO IMPROVE MOBILITY OF CHANNEL REGION OF FIN FIELD EFFECT TRANSISTOR (FINFET) DEVICE STRUCTURE

(71) Applicant: TAIWAN SEMICONDUCTOR MANUFACTURING CO., LTD., Hsinchu (TW)

(72) Inventors: Tsung-Yao Wen, Hsinchu (TW); Sheng-Chen Wang, Hsinchu (TW); Sai-Hooi Yeong, Zhubei (TW); Hsueh-Chang Sung, Zhubei (TW); Ya-Yun Cheng, Taichung (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 36 days.

This patent is subject to a terminal disclaimer.

(21) Appl. No.: 15/918,354

(22) Filed: Mar. 12, 2018

(65) Prior Publication Data
US 2018/0204726 A1     Jul. 19, 2018

Related U.S. Application Data

(63) Continuation of application No. 14/607,971, filed on Jan. 28, 2015, now Pat. No. 9,953,836.

(51) Int. Cl.
*H01L 29/78* (2006.01)
*H01L 21/265* (2006.01)
(Continued)

(52) U.S. Cl.
CPC ...... *H01L 21/26513* (2013.01); *H01L 21/324* (2013.01); *H01L 21/823431* (2013.01);
(Continued)

(58) Field of Classification Search
None
See application file for complete search history.

(56) References Cited

U.S. PATENT DOCUMENTS

| 8,497,171 B1 | 7/2013 | Wu et al. |
| 8,610,201 B1 | 12/2013 | Hokazono |

(Continued)

FOREIGN PATENT DOCUMENTS

| EP | 0901168 A2 | 3/1999 |
| KR | 10-1999-0029403 A | 4/1999 |

(Continued)

*Primary Examiner* — Abul Kalam
(74) *Attorney, Agent, or Firm* — Birch, Stewart, Kolasch & Birch, LLP

(57) ABSTRACT

A fin field device structure and method for forming the same are provided. The FinFET device structure includes a protruding structure extending from a substrate and an anti-punch through implant (APT) region formed in the protruding structure. The FinFET device structure includes a barrier layer formed on the APT region, and the barrier layer has a width in a horizontal direction. The width gradually tapers from a bottom of the barrier layer to a top of the barrier layer.

20 Claims, 12 Drawing Sheets

(51) Int. Cl.
  *H01L 21/8238* (2006.01)
  *H01L 21/8234* (2006.01)
  *H01L 29/66* (2006.01)
  *H01L 21/84* (2006.01)
  *H01L 27/092* (2006.01)
  *H01L 27/12* (2006.01)
  *H01L 29/10* (2006.01)
  *H01L 21/324* (2006.01)
  *H01L 29/04* (2006.01)
  *H01L 29/06* (2006.01)
  *H01L 29/161* (2006.01)
  *H01L 27/088* (2006.01)

(52) U.S. Cl.
  CPC ........... *H01L 21/823807* (2013.01); *H01L 21/823821* (2013.01); *H01L 21/845* (2013.01); *H01L 27/0924* (2013.01); *H01L 27/1211* (2013.01); *H01L 29/045* (2013.01); *H01L 29/0653* (2013.01); *H01L 29/1033* (2013.01); *H01L 29/1054* (2013.01); *H01L 29/1083* (2013.01); *H01L 29/161* (2013.01); *H01L 29/6656* (2013.01); *H01L 29/66795* (2013.01); *H01L 29/7851* (2013.01); *H01L 27/0886* (2013.01); *H01L 29/785* (2013.01)

(56) References Cited

U.S. PATENT DOCUMENTS

| | | |
|---|---|---|
| 2004/0262676 A1 | 12/2004 | Lee et al. |
| 2006/0170060 A1 | 8/2006 | Wu et al. |
| 2006/0284245 A1 | 12/2006 | Park et al. |
| 2007/0148926 A1 | 6/2007 | Datta et al. |
| 2007/0235763 A1 | 10/2007 | Doyle et al. |
| 2008/0001171 A1 | 1/2008 | Tezuka et al. |
| 2008/0157172 A1 | 7/2008 | Lee |
| 2010/0015773 A1* | 1/2010 | Park ............... H01L 21/28282 438/287 |
| 2012/0319211 A1 | 12/2012 | van Dal et al. |
| 2013/0161689 A1 | 6/2013 | Huo et al. |
| 2014/0054679 A1 | 2/2014 | Tang et al. |
| 2014/0225065 A1 | 8/2014 | Rachmady et al. |
| 2014/0227846 A1 | 8/2014 | Liaw |
| 2014/0302645 A1 | 10/2014 | Rodder et al. |
| 2015/0044829 A1 | 2/2015 | Kim et al. |
| 2015/0214365 A1 | 7/2015 | Xie et al. |
| 2015/0255545 A1 | 9/2015 | Holland et al. |
| 2016/0104765 A1 | 4/2016 | Ching et al. |

FOREIGN PATENT DOCUMENTS

| | | |
|---|---|---|
| KR | 10-2005-0002259 A | 1/2005 |
| TW | 201448120 A | 12/2014 |
| WO | WO 2013/022753 A2 | 2/2013 |

* cited by examiner

BARRIER LAYER ABOVE ANTI-PUNCH THROUGH (APT) IMPLANT REGION TO IMPROVE MOBILITY OF CHANNEL REGION OF FIN FIELD EFFECT TRANSISTOR (FINFET) DEVICE STRUCTURE

CROSS REFERENCE TO RELATED APPLICATIONS

This application is related to the co-pending a commonly assigned patent application U.S. Ser. No. 14/607,780, filed on Jan. 28, 2015 and entitled "Method of forming semiconductor structure with anti-punch through structure", the entirety of which is incorporated by reference herein. This application is a Continuation application of U.S. patent application Ser. No. 14/607,971, filed on Jan. 28, 2015, the entire of which is incorporated by reference herein

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are tfabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
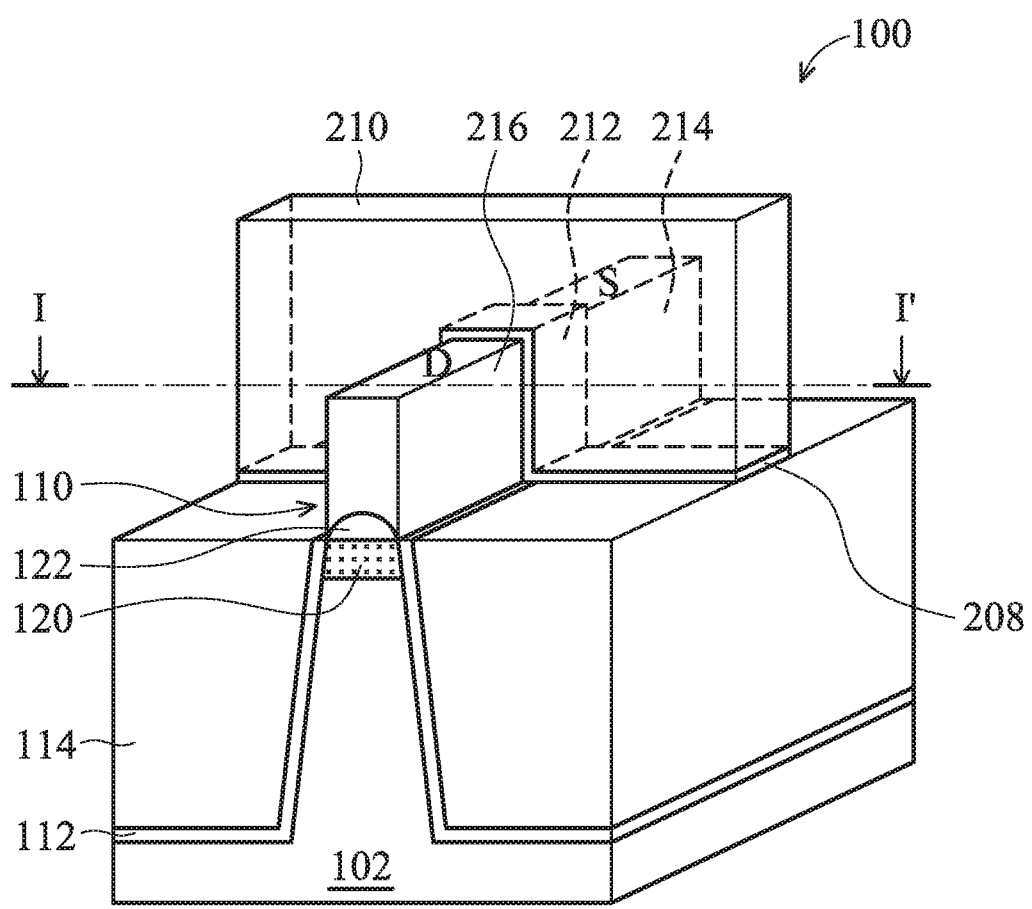
FIG. 1 shows a perspective representation of a fin field effect transistor (FinFET) device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a fin field effect transistor (FinFET) device structure are provided. FIG. 1A shows a perspective representation of a fin field effect transistor (FinFET) device structure 100, in accordance with some embodiments of the disclosure.

FinFET device structure 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The FinFET device structure 100 also includes a fin structure 110 (e.g., Si fins) that extends from the substrate 102. In some other embodiments, more than one fin structure 110 extends from the substrate 102. The fin structure 104 may optionally include germanium (Ge). The fin structure 110 may be formed by using suitable processes such as photolithography and etching processes. In some embodiments, the fin structure 110 is etched from the substrate 102 using dry etch or plasma processes.

An isolation structure 114, such as a shallow trench isolation (STI) structure, is formed to surround the fin structure 110. In some embodiments, a lower portion of the fin structure 110 is surrounded by the isolation structure 114, and an upper portion of the fin structure 110 protrudes from the isolation structure 114, as shown in FIG. 1. In other words, a portion of the fin structure 110 is embedded in the isolation structure 114. The isolation structure 114 prevents electrical interference or crosstalk.

The FinFET device structure 100 further includes a gate stack structure including a gate dielectric layer 208 and a gate electrode 210. The gate stack structure is formed over a central portion of the fin structure 110. In some embodiments, multiple gate stack structures are formed over the fin structure 110. Numerous other layers may also be present in the gate structures, for example, capping layers, interface layers, spacer elements, and/or other suitable features.

The gate dielectric layer 208 may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

The gate electrode 110 may include polysilicon or metal. Metal includes tantalum nitride (TaN), nickel silicon (NiSi), cobalt silicon (CoSi), molybdenum (Mo), copper (Cu), tungsten (W), alumina (Al), cobalt (Co), zirconium (Zr), platinum (Pt), or other applicable materials. The gate electrode 110 may be formed in a gate last process (or gate replacement process). In some embodiments, the gate stack structure includes additional layers, such as interfacial layers, capping layers, diffusion/barrier layers, or other applicable layers.

The fin structure 110 includes a channel region 212 surrounded or wrapped by gate electrode 210 and gate dielectric layer 208. The fin structure 110 may be doped to provide a suitable channel for an n-type FinFET (NMOS device) or a p-type FinFET (PMOS device). The fin structures 104 may be doped using a suitable process, such as an ion implantation process, diffusion process, annealing process, other applicable processes, or combinations thereof. The fin structure 110 includes a source region 214 and a drain region 216 between the channel region 212. The FinFET device 100 may be a device included in a microprocessor, memory cell (e.g., Static Random-Access Memory (SRAM)), and/or other integrated circuits.

A liner layer 112 is conformally formed on the sidewalls of the fin structure 110. An anti-punch through implant (APT) region 120 is formed in the fin structure 110 and is lower than a top surface of the isolation structure 114. The APT region 120 is used to reduce sub-threshold source-to-drain leakage and Drain-Induced Barrier Lowering (DIBL). A barrier layer 122 is formed on the APT region 120 to prevent the APT region 120 from diffusing into the channel region 212. The detail formation method of the APT region 120 and the barrier layer 122 are described later.

FIG. 2A-2H show cross-sectional representations of forming a fin field effect transistor (FinFET) device structure 100, in accordance with some embodiments of the disclosure. FIG. 2A-2H show cross-sectional representations along the line I-I' in FIG. 1.

Figure 2A:
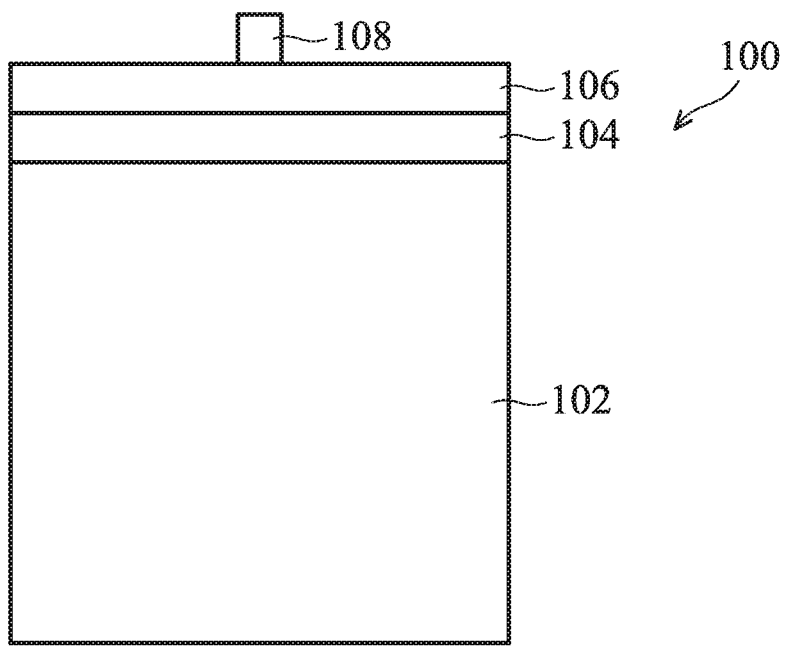
FIG. 2A-2H show cross-sectional representations of forming a fin field effect transistor (FinFET) device structure, in accordance with some embodiments of the disclosure.

Referring to FIG. 2A, the substrate 102 is provided. In some embodiments, a silicon (Si) substrate 102 is provided. Afterwards, an oxide layer 104 and a hard mask layer 106 are formed on the substrate 102, and a photoresist layer 108 is formed on the hard mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

The oxide layer 104 is a buffer layer between the substrate 102 and the hard mask layer 106. In addition, the oxide layer 104 is used as a stopping layer when the hard mask layer 106 is removed. The oxide layer 104 may be made of silicon oxide. The hard mask 106 may be made of silicon oxide, silicon nitride, silicon oxynitride, or another applicable material. In some other embodiments, more than one hard mask layer 106 is formed on the oxide layer 104.

The oxide layer 104 and the hard mask layer 106 are formed by deposition processes, such as a chemical vapor deposition (CVD) process, high-density plasma chemical vapor deposition (HDPCVD) process, spin-on process, sputtering process, or other applicable processes.

Figure 2B:
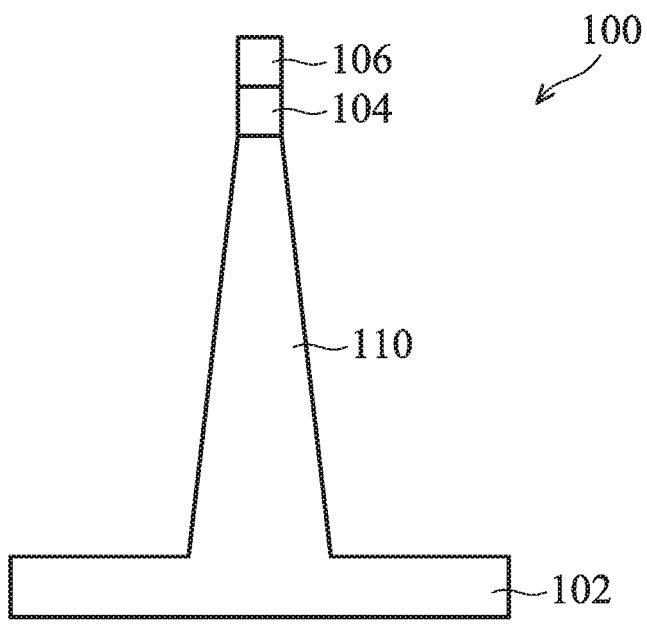

After the photoresist layer 108 is patterned, the oxide layer 104 and the hard mask layer 106 are patterned by using the patterned photoresist layer 108 as a mask as shown in FIG. 2B, in accordance with some embodiments. As a result, a patterned oxide layer 104 and a patterned hard mask layer 106 are obtained. Afterwards, an etching process is performed on the substrate 102 to form the fin structure 110 by using the patterned oxide layer 104 and the patterned hard mask layer 106 as a mask.

It should be noted that the number of the fin structures 110 may be adjusted according to actual application, and it is not limited to one fin structure 110. The fin structure 110 has a width that gradually increases from the top portion to the lower portion.

The etching process may be a dry etching process or a wet etching process. In some embodiments, the substrate 102 is etched by a dry etching process, and the fluorine-based etchant gas includes $SF_6$, $C_xF_y$, $NF_3$ or combinations thereof. The etching process may be a time-controlled process, and continue until the fin structure 110 reaches a predetermined height.

Figure 2C:
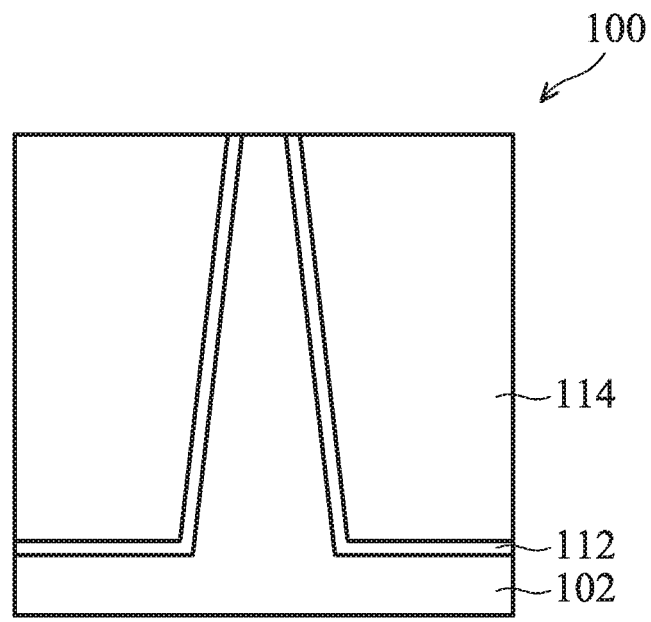

After the fin structure 110 is formed, a liner layer 112 is conformally formed on the sidewalls of the fin structure 110 as shown in FIG. 2C, in accordance with some embodiments.

The liner layer 112 is used to protect the fin structures 110 from being damaged by the following processes (such as an anneal process or an etching process). Therefore, the profile of the fin structures 110 is preserved by the protection of the liner layer 112. The liner layer 112 includes silicon nitride, silicon oxynitride, silicon carbide, silicon oxycarbonnitride or combinations thereof. The liner layer 112 may have a single layer or multiple layers.

Afterwards, a dielectric material is formed on the fin structure 110 and the liner layer 112, and then the dielectric material is thinned or planarized to form the isolation structure 114. As a result, the top surface of the isolation structure 114 is level with the top surface of the fin structure 110. The isolation structure 114 is made of silicon oxide, silicon nitride, or another applicable materials. The isolation structure 114 may be deposited by a chemical vapor deposition (CVD) process, a spin-on-glass process, or another applicable process.

Figure 2D:
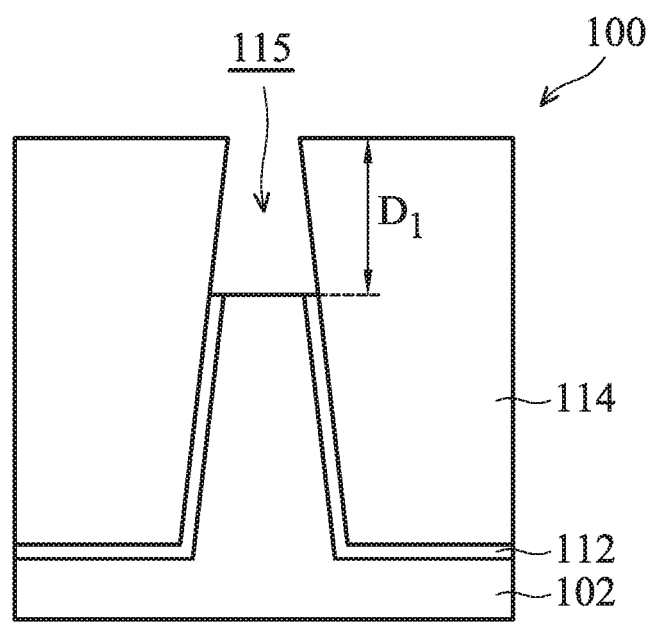

Afterwards, a top portion of the fin structure 110 and a portion of the liner layer 112 are removed as shown in FIG. 2D, in accordance with some embodiments. As a result, a recess 115 is formed in the isolation structure 114. In some embodiments, the portion of the fin structure 110 and the portion of the liner layer 112 are removed by an etching process, such as a dry etching process or a wet etching process. The recess 115 has a first depth $D_1$. In some embodiments, the first depth $D_1$ is in a range from about 40 nm to 70 nm.

Figure 2E:
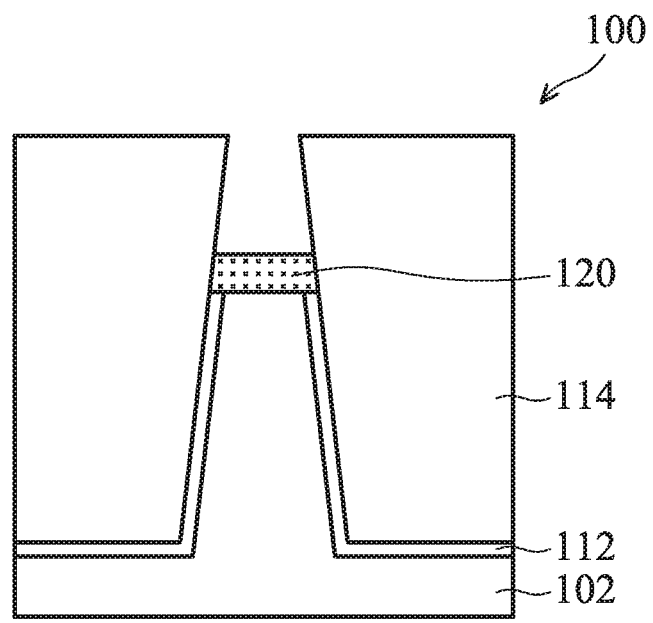

Afterward the etching process, an anti-punch through implant (APT) region 120 is formed in the fin structure 110 as shown in FIG. 2E, in accordance with some embodiments. The APT region 120 may be an n-type APT region or a p-type APT region. In some embodiments, n-type APT region is obtained by doping with n-type dopant, such as arsenic (As), phosphorous (P) or antimony (Sb). In some embodiments, p-type APT region is obtained by doping with p-type dopant, such as boron (B) or boron fluorine ($BF_2$). In some embodiments, an ion implantation (IMP) process is performed to form the APT region 120. In some embodiments, the IMP process is operated under power in a range from about 3 keV to about 7 keV on the surface region.

After the APT region 120 is formed, a thermal process is performed to activate the dopant in the APT region 120. In some embodiments, the thermal process is performed by a rapid thermal annealing process.

Figure 2F:
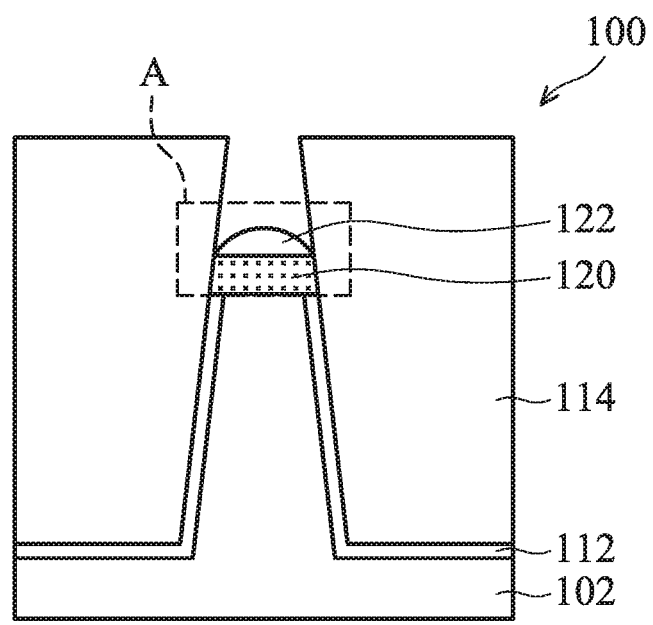

After the APT region 120 is formed, a barrier layer 122 formed on the APT region 120 as shown in FIG. 2F, in accordance with some embodiments. The barrier layer 122 is used to block the diffusion of the APT region 120. The barrier layer 122 includes silicon carbide (SiC), silicon germanium carbide (SiGeC) or combinations thereof.

In some embodiments, the barrier layer 122 is made of silicon carbide (SiC), the concentration of carbon is in a range from about 0.5% to about 1.0%. If the concentration of carbon is too low, the barrier effect of the barrier layer 122 is not good enough. If the concentration of carbon is too high, the lattice constant of the barrier layer 122 will mismatch with that of the substrate 102.

In some embodiments, the barrier layer 122 is made of silicon germanium carbide (SiGeC), the concentration of carbon is in a range from about 0.5% to about 1.0%, and the concentration of germanium is in a range from about 5% to about 20%. If the concentration of carbon is too low, the barrier effect of the barrier layer 122 is not good enough. If the concentration of carbon is too high, the lattice constant of the barrier layer 122 will mismatch with that of the substrate 102.

In some embodiments, the barrier layer 122 is formed by epitaxial (epi) process. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, or other suitable epi processes. In some embodiments, the barrier layer 122 is formed by an epitaxial process which is operated at a temperature in a range from about 450 degrees to about 650 degrees. In some embodiments, the barrier layer 122 is formed by an epitaxial process which is operated at a pressure in a range from about 1 torr to about 50 torr.

Figure 3:
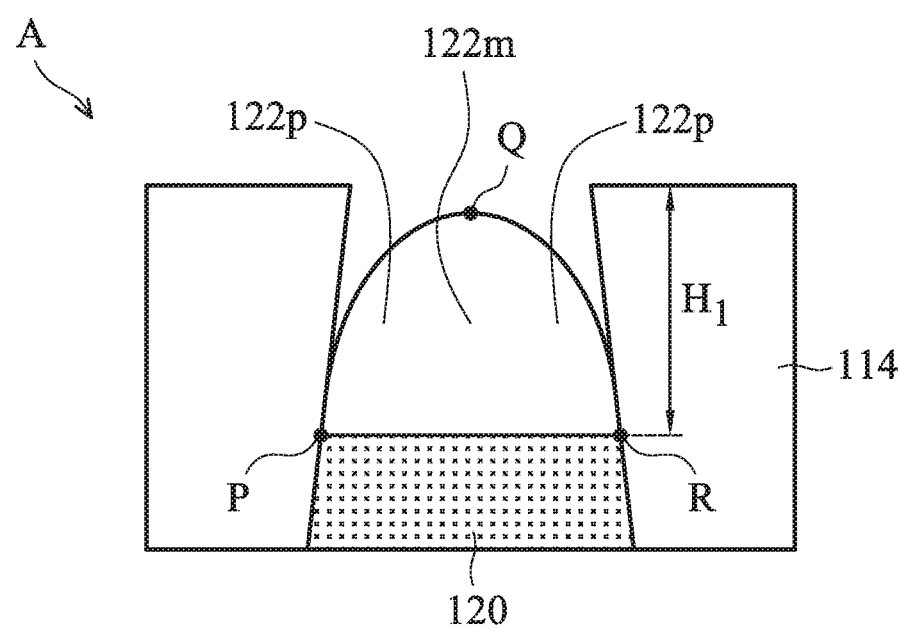
FIG. 3 shows an enlarged cross-sectional representation of a region A of FIG. 2F, in accordance with some embodiments of the disclosure.

FIG. 3 shows an enlarged cross-sectional representation of a region A of FIG. 2F, in accordance with some embodiments of the disclosure. The barrier layer 122 has a convex profile and it is epitaxially grown along the (111) plane. In some embodiments, the barrier layer 122 has convex meniscus structure.

The barrier layer 122 has a middle portion 122m and a peripheral portion 122p. The middle portion 122m is higher than the peripheral portion 122p. A point P and a point R are located at a lowest position of the peripheral portion 122p. The point P and R are substantially level with a top surface of the APT region 120. A highest point Q is located at the middle portion 122m. The middle portion 122m has a raised height $H_1$ over a top surface of the APT region 120. The raised height $H_1$ is measured from a bottom surface of the middle portion 122m to the point Q. In some embodiments, the raised height $H_1$ is in a range from about 5 nm to about 10 nm. If the raised height $H_1$ is too low, the ability to control APT back diffusion may be reduced. If the raise height $H_1$ is too high, the channel stress will be loss and the mobility may be degraded.

Figure 2G:
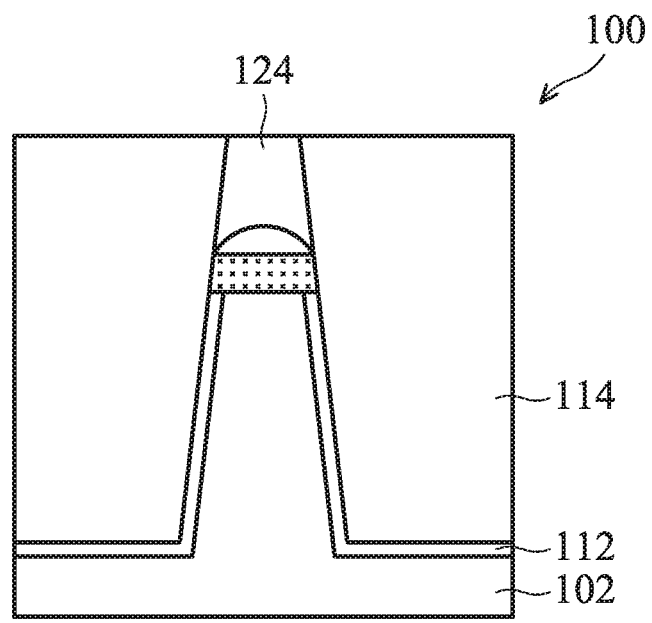

After the barrier layer 122 is formed, an epitaxial layer 124 is formed on the barrier layer 122 as shown in FIG. 2G, in accordance with some embodiments of the disclosure. The epitaxial layer 124 is used as a strained layer. A portion of the epitaxial layer 124 which is below a gate electrode layer is called as a channel region. For example, as shown in FIG. 1, the channel region 212 is formed below the gate electrode 210. When a p-type FinFET device structure is formed, the channel region 212 of the semiconductor device 100 is strained by forming the epitaxial layer 124. Therefore, the mobility of the channel region 212 is improved.

The epitaxial layer 124 includes silicon germanium (SiGe), germanium (Ge) or combinations thereof. In some embodiments, when the epitaxial layer 124 is made of silicon germanium (SiGe), the concentration of germanium is in a range from about 50% to about 70%.

In some embodiments, the epitaxial layer 124 is formed by an epitaxial (epi) process. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, or another suitable epitaxial process.

In some embodiments, the epitaxial layer 124 is formed by an epitaxial process which is operated at a temperature in a range from about 450 degrees to about 650 degrees. However, the epitaxial process is a thermal process. It should be noted that this thermal process is performed after the APT region 120 is formed. If no barrier layer is formed over the APT region 120, the dopant may diffuse into the channel region (such as the epitaxial layer 124) which is located above the APT region 120. As a result, the mobility of the channel region may be reduced due to the diffusion of the dopant. In order to slow down or block the diffusion of the dopant of the APT region 120, the barrier layer 122 is formed above the APT region 120. In other words, the barrier layer 122 is formed between the APT region 120 and the epitaxial layer 124 (or the channel region).

It should be noted that the barrier layer 122 and the epitaxial layer 124 both are formed by epitaxial (epi) process. Therefore, forming the barrier layer 122 and forming the epitaxial layer 124 are performed in-situ in a chamber without being transported to another station for convenience and efficiency. In addition, the fabricating cost is reduced.

Figure 2H:
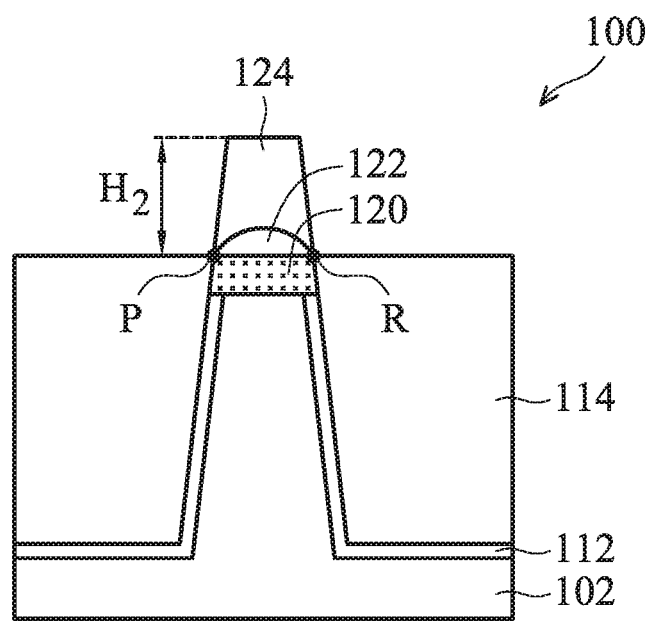

After the epitaxial layer 124 is formed, a portion of isolation structure 114 is removed to expose the top surface of the epitaxial layer 124 as shown in FIG. 2H, in accordance with some embodiments of the disclosure.

If the barrier layer 122 has a rectangular shape, the fin height may be reduced because the barrier layer 122 occupies space. In contrast, since the barrier layer 122 has a convex meniscus structure, the fin height $H_2$ is not reduced. The fin height $H_2$ is measured from point P or point R, and the point P or R is at the lowest position of the barrier layer 122. The fin height $H_2$ is measured from the point P to a top surface of the epitaxial layer 124. Therefore, the fin height is not reduced due to formation of convex profile of barrier layer 122. In some embodiments, the fin height $H_2$ is in a range from about 20 nm to about 60 nm.

FIG. 4A-4L show cross-sectional representations of forming a fin field effect transistor (FinFET) device structure 200, in accordance with some embodiments of the disclosure.

Figure 4A:
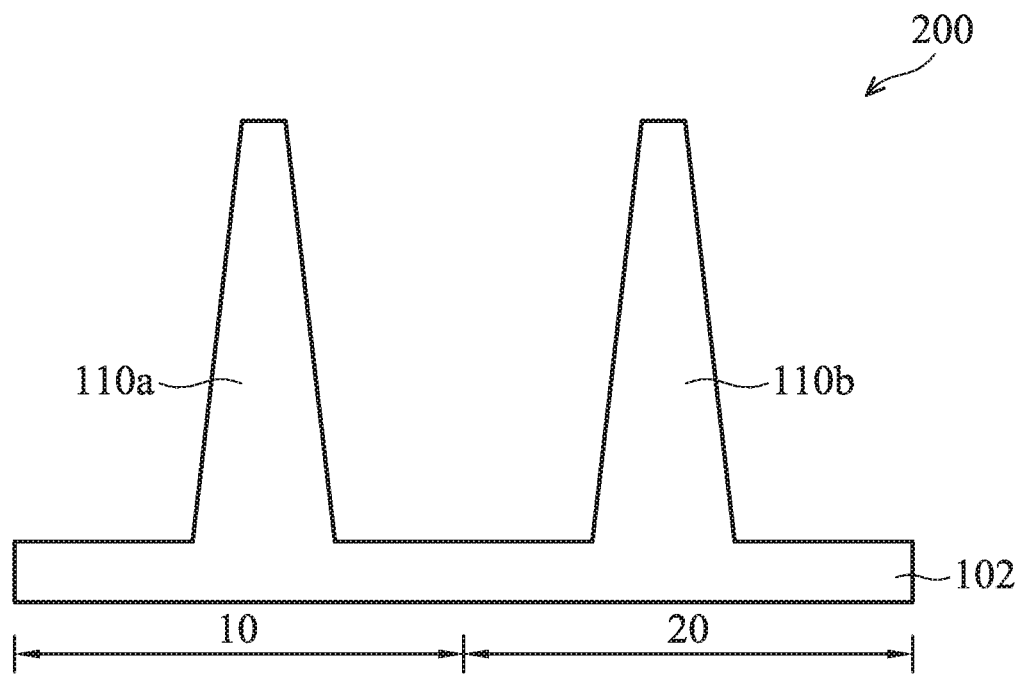
FIG. 4A-4L show cross-sectional representations of forming a fin field effect transistor (FinFET) device structure, in accordance with some embodiments of the disclosure.

Referring to FIG. 4A, the substrate 102 is divided into a first region 10 and a second region 20. A first fin structure 110a is formed in the first region 10 and a second fin structure 110b is formed in the second region 20. A p-type FinFET device structure will be formed in the first region 10, and a n-type FinFET device structure will be formed in the second region 20.

Figure 4B:
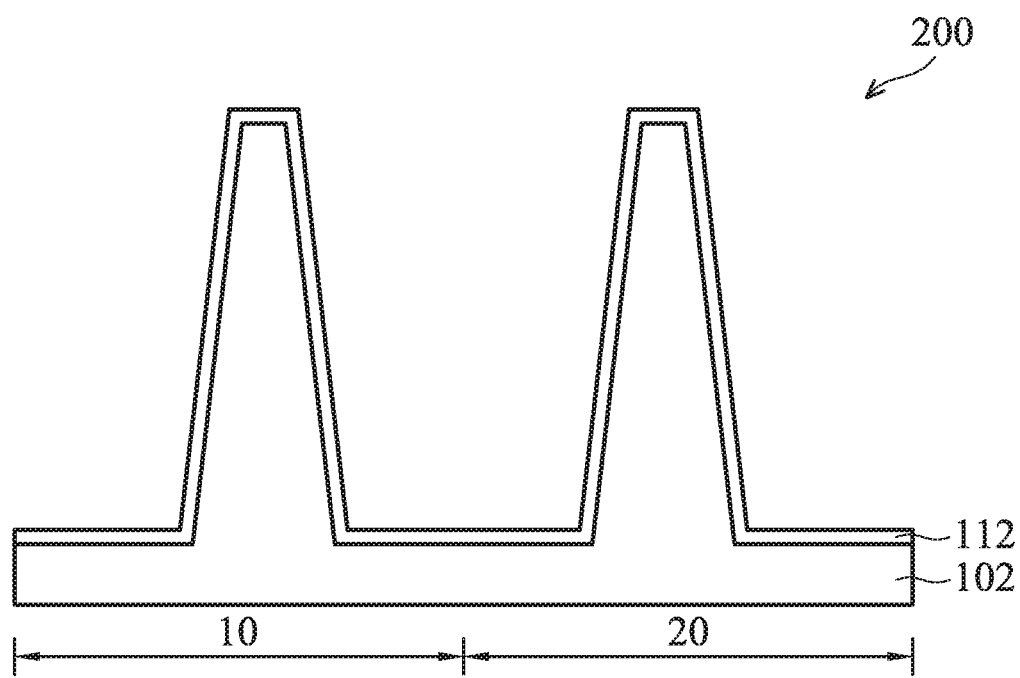

After the first fin structure 110a and the second fin structure 110b are formed, a liner layer 112 is conformally formed on the sidewalls of the first fin structure 110a and the second fin structure 110b as shown in FIG. 4B, in accordance with some embodiments of the disclosure.

Figure 4C:
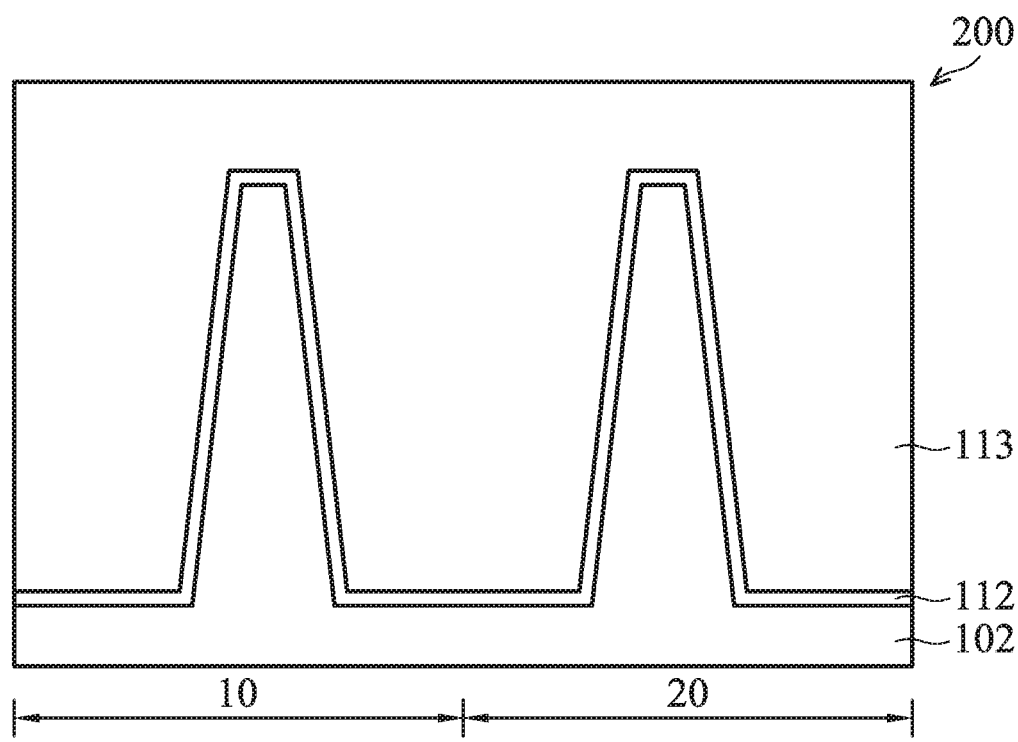

After the liner layer 112 is formed, a dielectric layer 113 is deposited on the liner layer 112 as shown in FIG. 4C, in accordance with some embodiments of the disclosure.

Afterwards, a planarizing process is performed on the dielectric layer 113 to expose a top surface of the first fin structure 110a and the second fin structure 110b. As a result, the isolation structure 114 is obtained. In some embodiments, the planarizing process is a chemical mechanical polishing (CMP) process.

Figure 4D:
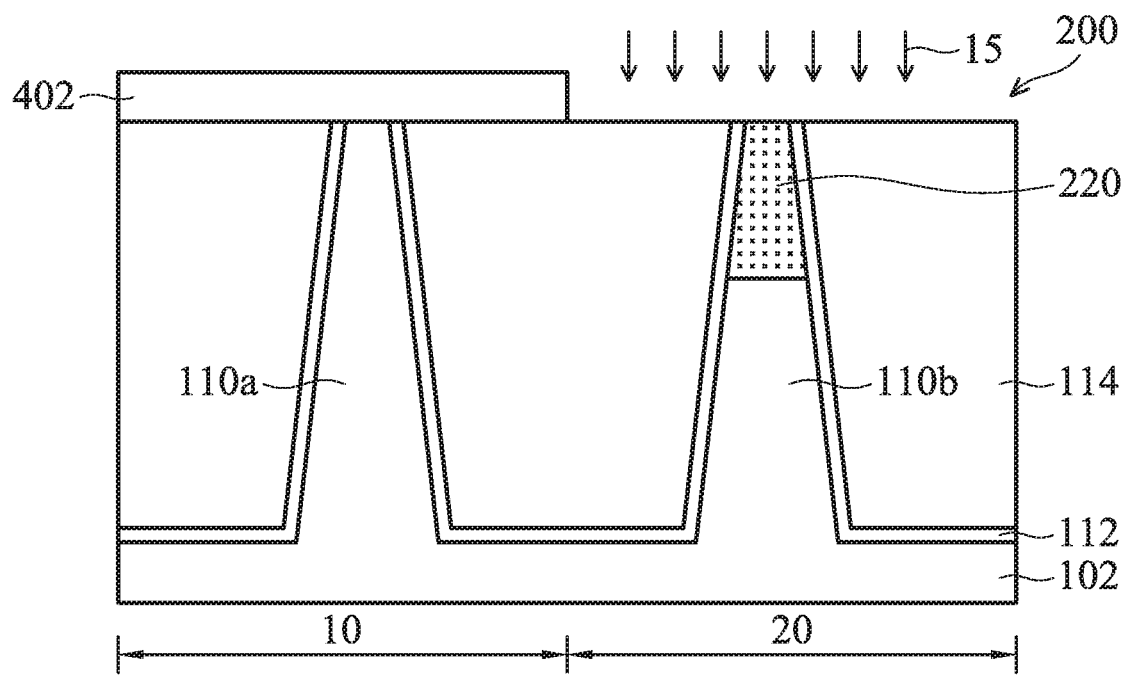

Afterwards, a first photoresist (PR) layer 402 is formed on the first fin structure 110a on the first region 10 as shown in FIG. 4D, in accordance with some embodiments of the disclosure. The first photoresist layer 402 is deposited on the first region 10 and the second region 20, and the first photoresist layer 402 is patterned to form a patterned first photoresist layer 402 in the first region 10. The patterned first photoresist layer 402 is used to protect the underlying layers.

Afterwards, a first ion implant process 15 is performed on the second fin structure 110b to form a second APT region 220 in a top portion of the second fin structure 110b. In some embodiments, a n-type FinFET device structure is formed in the second region 20, a p-type dopant, such as such as boron (B) or boron fluorine ($BF_2$) is doped into the second fin structure 110b.

Figure 4E:
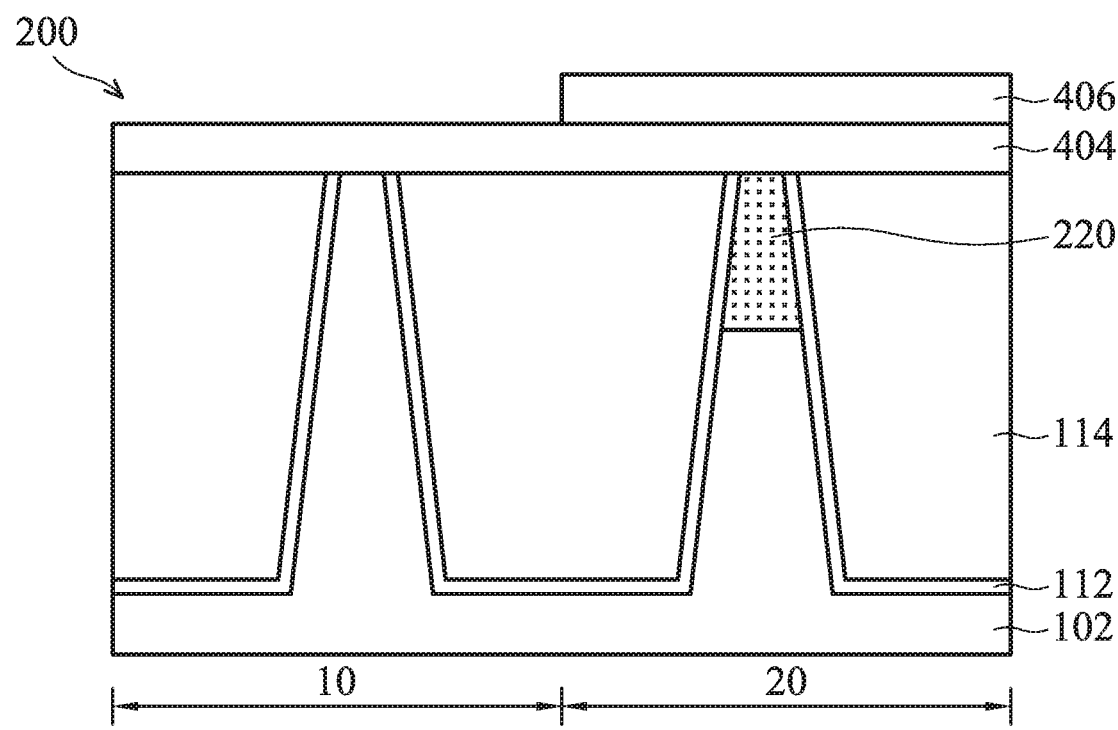

After the second APT region 220 is formed, a hard mask layer 404 is formed on the first fin structure 110a and the second APT region 220 as shown in FIG. 4E, in accordance with some embodiments of the disclosure. Afterwards, a second photoresist layer 406 is formed and patterned on the hard mask layer 404 to form a patterned second photoresist layer 406.

Figure 4F:
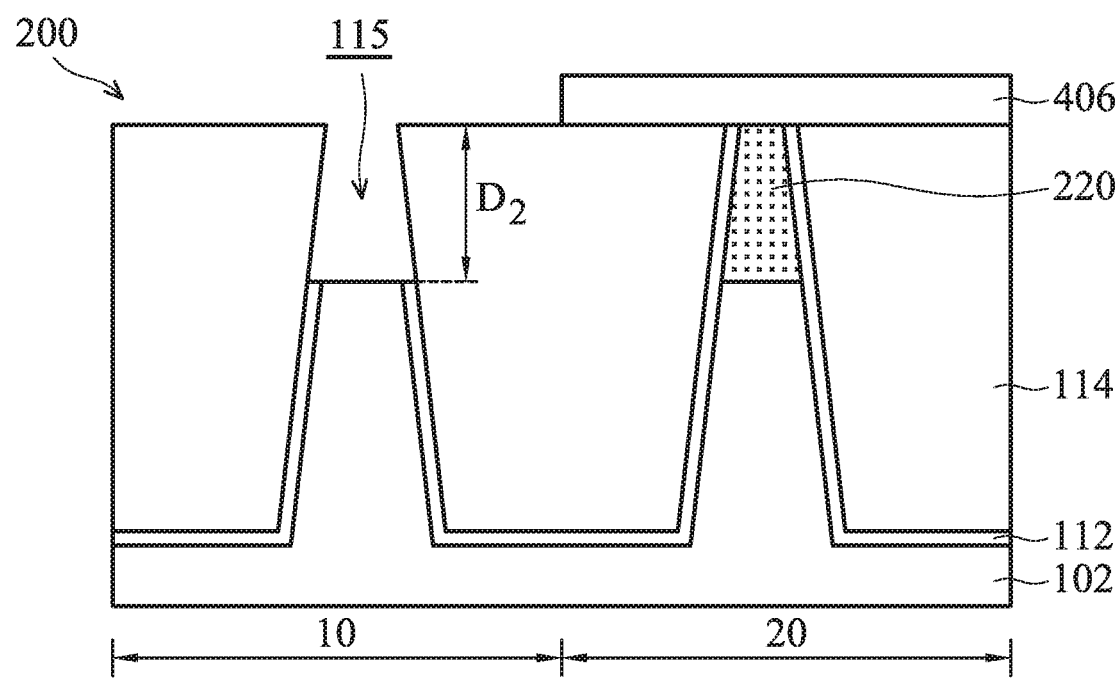

After the patterned second photoresist layer 406 is formed, the hard mask layer 404 is patterned by using the patterned second photoresist layer 406 as a mask as shown in FIG. 4F, in accordance with some embodiments of the disclosure.

Afterwards, a top portion of the first fin structure 110a is removed to form a recess 115 in the isolation structure 114. In addition, a top portion of the liner layer 112 is removed. Therefore, the isolation structure 114 is exposed in the recess 115. The recess 115 has a second depth $D_2$. In some embodiments, the second depth $D_2$ is in a range from about 40 nm to about 70 nm.

Figure 4G:
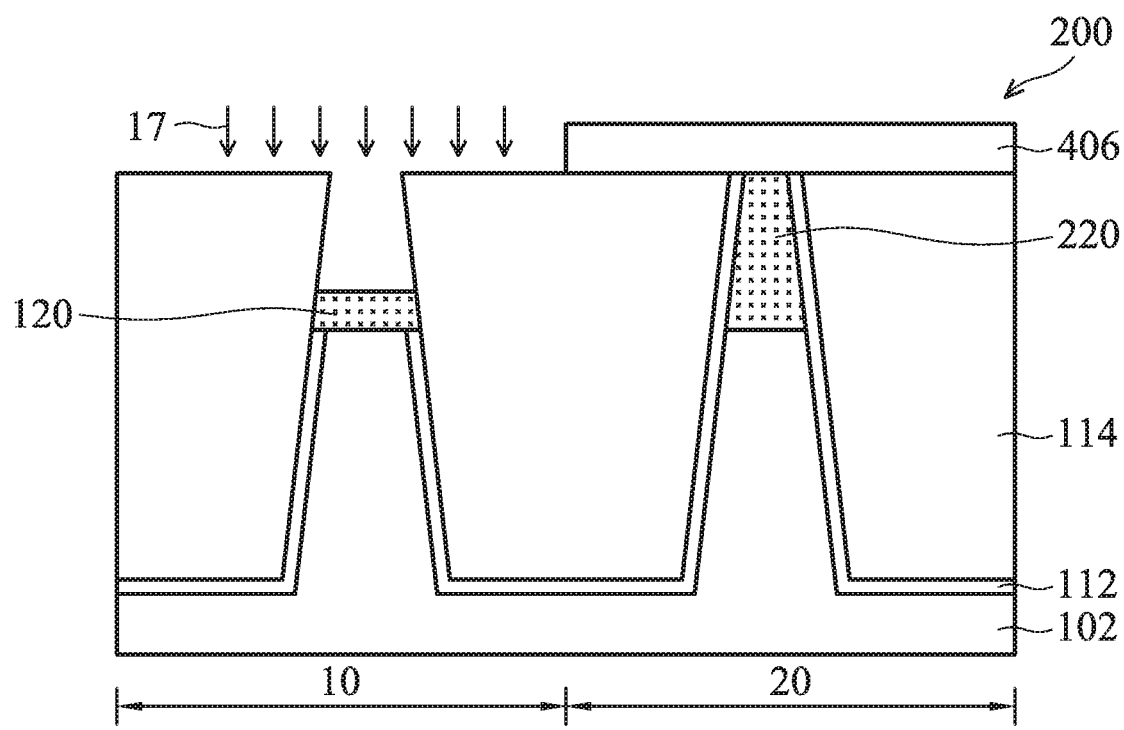

After the etching process, a second ion implant process 17 is performed on the first region 10 to form a first APT region 120 is formed in the first fin structure 110a as shown in FIG. 4G, in accordance with some embodiments. In some embodiments, a p-type FinFET device structure is formed in the first region 10, a n-type dopant, such as arsenic (As), phosphorous (P) or antimony (Sb) is doped into the first fin structure 110a.

Figure 4H:
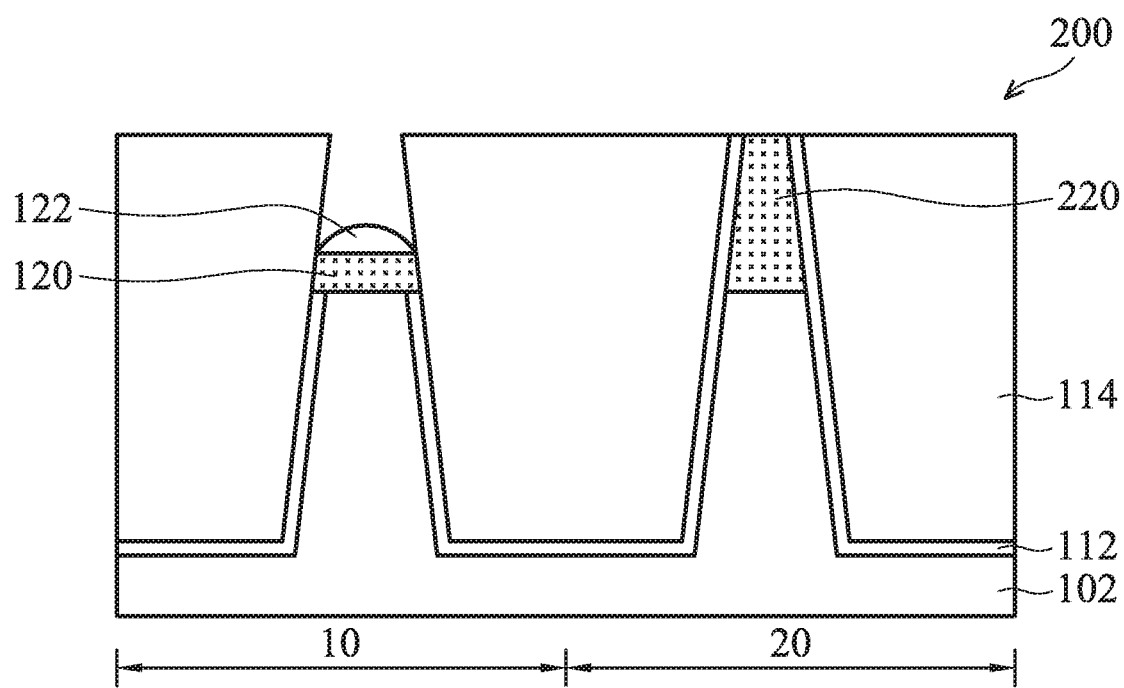

After the first APT region 120 is formed, a barrier layer 122 formed on the APT region 120 as shown in FIG. 4H, in accordance with some embodiments. The barrier layer 122 is used to block the diffusion of the APT region 120 into the channel region (formed later). The barrier layer 122 has a convex structure with a middle portion 122m higher than a peripheral portion 122p. The barrier layer 122 includes silicon carbide (SiC), silicon germanium carbide (SiGeC) or combinations thereof.

Figure 4I:
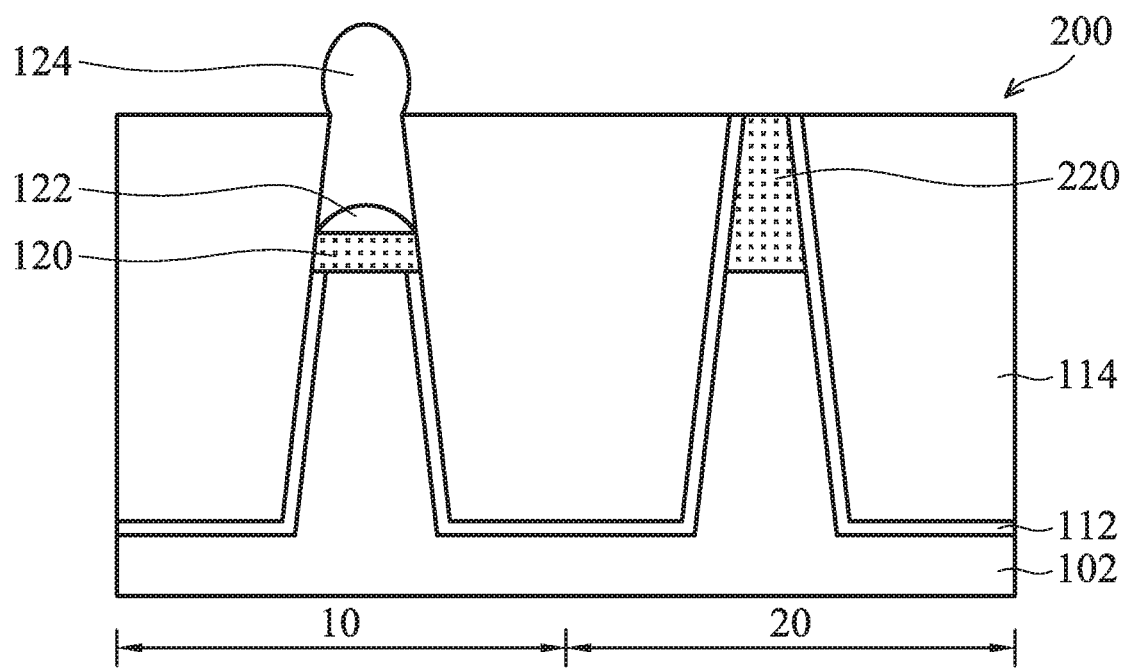

After the barrier layer 122 is formed, an epitaxial layer 124 is formed on the barrier layer 122 as shown in FIG. 4I, in accordance with some embodiments. The epitaxial layer 124 is used as a strained layer when a p-type FinFET device structure is formed in the first region 10. The epitaxial layer 124 includes silicon germanium (SiGe), germanium (Ge) or combinations thereof. The epitaxial layer 124 is formed by an epitaxial process.

In some embodiments, the barrier layer 122 and epitaxial layer 124 are formed in-situ in the same chamber without transporting to another chamber. Therefore, the fabrication operations and cost are reduced.

Figure 4J:
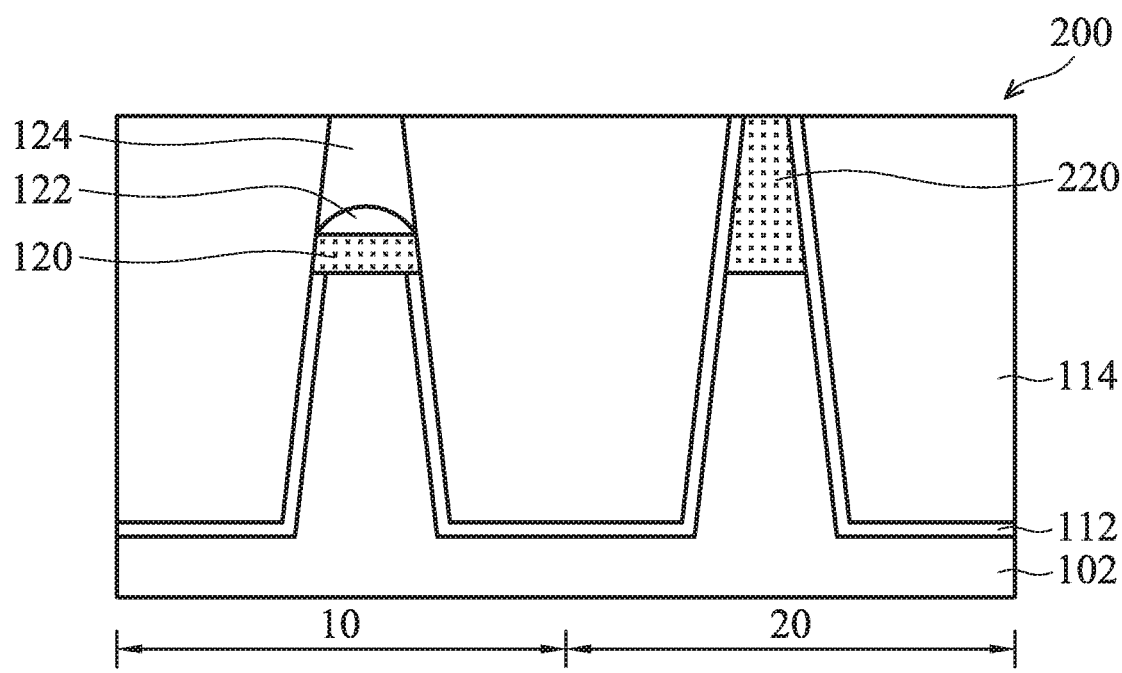

After the epitaxial layer 124 is formed, a planarizing process is performed on the epitaxial layer 124 to level with the top surface of the epitaxial layer 124 and the top surface of the isolation structure 114 as shown in FIG. 4J, in accordance with some embodiments. In some embodiments, the planarizing process is a chemical mechanical polishing (CMP) process.

Figure 4K:
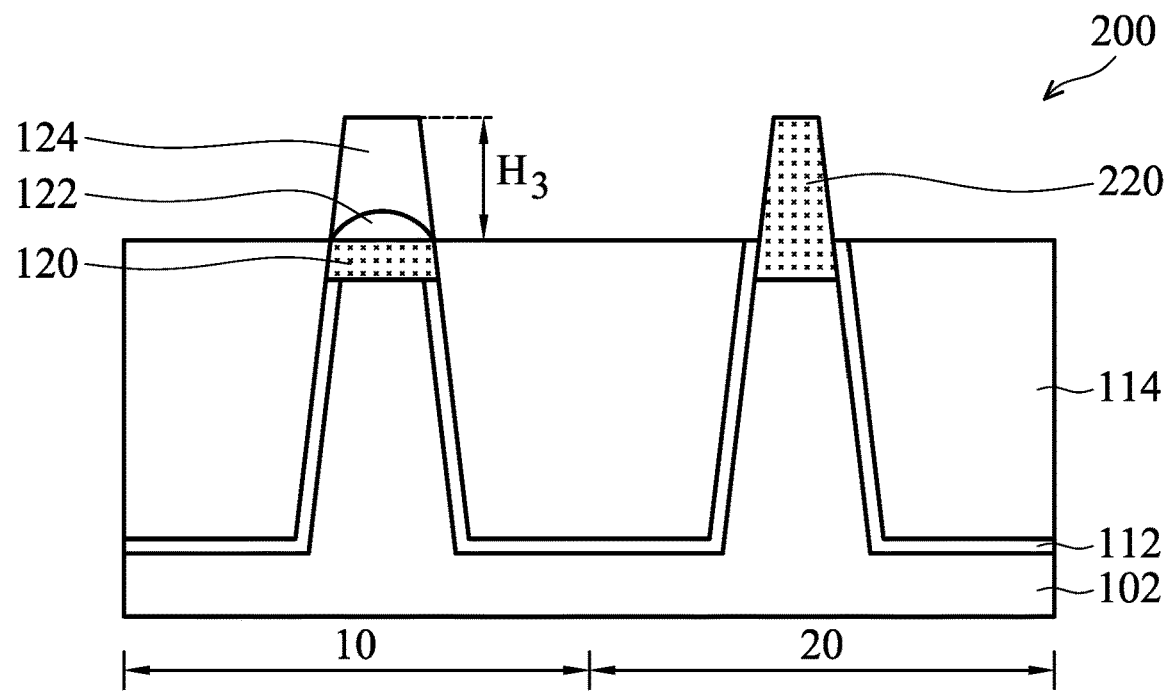

After the planarizing process, a portion of the isolation structure 114 is removed to expose the epitaxial layer 124 and the barrier layer 122 as shown in FIG. 4K, in accordance with some embodiments. The portion of the dielectric layer 114 is removed by an etching process, such as a dry etching process or a wet etching process.

Figure 4L:
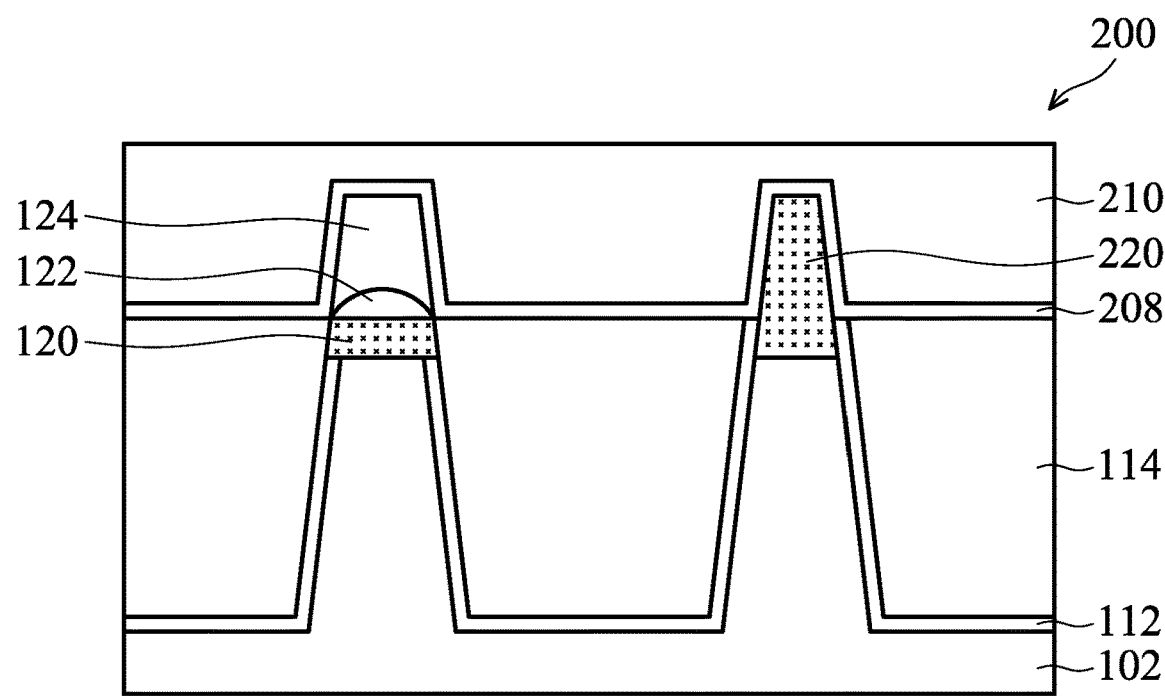

After the portion of the isolation structure 114 is removed, a gate dielectric layer 208 is formed on the first fin structure 110a and the second fin structure 110b as shown in FIG. 4L, in accordance with some embodiments. Afterwards, a gate electrode 210 is formed on the gate dielectric layer 208.

It should be noted that a portion of the epitaxial layer 124 is used as the channel region. The barrier layer 122 is configured to block the diffusion of the APT region 120. Since the diffusion of the APT region 120 is blocked, the mobility of the channel region is improved by formation of the barrier layer 120 between the APT region 120 and the epitaxial layer 124. Therefore, the performance of the fin field effect transistor (FinFET) device structure 200 is improved. In addition, the barrier layer 120 has a specific convex shape, and therefore the fin height $H_3$ is not reduced.

Embodiments for forming a fin field effect transistor (FinFET) device structure are provided. A fin structure is formed on a substrate. An anti-punch through implant (APT) region is formed in the fin structure, and a barrier layer is formed on the APT region. An epitaxial layer is formed on the barrier layer, a portion of the epitaxial layer is used as a channel region. The barrier layer is formed between the APT region and the channel region to slow down or block the diffusion of the dopants of the APT region. Therefore, the mobility of the channel region is improved, and the performance of the FinFET device structure is further improved.

In some embodiments, a fin field effect transistor (FinFET) device structure is provided. The FinFET device structure includes a protruding structure extending from a substrate and an anti-punch through implant (APT) region formed in the protruding structure. The FinFET device structure includes a barrier layer formed on the APT region, and the barrier layer has a width in a horizontal direction. The width gradually tapers from a bottom of the barrier layer to a top of the barrier layer.

In some embodiments, a fin field effect transistor (FinFET) device structure is provided. The FinFET device structure includes a first fin structure and a second fin structure formed on a substrate. The FinFET device structure also includes a first anti-punch through implant (APT) region formed in the first fin structure and a barrier layer formed on the first APT region. The barrier layer has a curved top surface. The FinFET device structure further includes an epitaxial layer formed on the barrier layer and a second APT region formed in the second fin structure. The curved top surface of the barrier layer is lower than a top surface of the second APT region.

In some embodiments, a fin field effect transistor (FinFET) device structure is provided. The FinFET device structure includes a first fin structure and a second fin structure extending from a substrate. The FinFET device structure includes a first anti-punch through implant (APT) region formed in the first fin structure and a barrier layer formed on the first APT region. The FinFET device structure also includes a second APT region formed over the second fin structure. The barrier layer has a convex cross-sectional profile with two outer-most points which are level with a bottom surface of the second APT region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
   a protruding structure extending from a substrate;
   a first anti-punch through implant (APT) region formed in the protruding structure;
   a barrier layer formed on the first APT region, wherein the barrier layer has a width in a horizontal direction, and the width gradually tapers from a bottom surface of the barrier layer to a top surface of the barrier layer; and
   a second APT region formed over the substrate, wherein a top surface of the second APT region is higher than the top surface of the barrier layer.

2. The fin field effect transistor (FinFET) device structure as claimed in claim 1, wherein the barrier layer has convex structure.

3. The fin field effect transistor (FinFET) device structure as claimed in claim 1, wherein the barrier layer comprises silicon carbide (SiC) or silicon germanium carbide (SiGeC).

4. The fin field effect transistor (FinFET) device structure as claimed in claim 1, wherein the barrier layer is epitaxially grown along a (111) plane.

5. The fin field effect transistor (FinFET) device structure as claimed in claim 1, further comprising:
   an isolation structure formed on the substrate, wherein the protruding structure is embedded in the isolation structure, and the first APT region is below a top surface of the isolation structure.

6. The fin field effect transistor (FinFET) device structure as claimed in claim 1, further comprising:
   an epitaxial layer formed on the barrier layer; and
   a liner formed on the sidewalls of the protruding structure.

7. The fin field effect transistor (FinFET) device structure as claimed in claim 6, wherein the epitaxial layer comprises silicon germanium (SiGe), germanium (Ge) or combinations thereof.

8. The fin field effect transistor (FinFET) device structure as claimed in claim 1, wherein the top surface of the barrier layer is a curved surface, a height in a vertical direction is a distance between a top surface of the first APT region and the top surface of the barrier layer, and the height is not a constant.

9. The fin field effect transistor (FinFET) device structure as claimed in claim 1, wherein the entire barrier layer is higher than a top surface of the first APT region.

10. The fin field effect transistor (FinFET) device structure as claimed in claim 1, further comprising:
    an isolation structure formed over the substrate, wherein a portion of the protruding structure extends above the isolation structure, wherein an interface of the APT region and the barrier layer is substantially leveled with a top surface of the isolation structure.

11. A fin field effect transistor (FinFET) device structure, comprising:
    a first fin structure and a second fin structure formed on a substrate;
    a first anti-punch through implant (APT) region formed in the first fin structure;
    a barrier layer formed on the first APT region, wherein the barrier layer has a curved top surface;
    an epitaxial layer formed on the barrier layer; and
    a second APT region formed in the second fin structure, wherein the curved top surface of the barrier layer is lower than a top surface of the second APT region.

12. The fin field effect transistor (FinFET) device structure as claimed in claim 11, wherein the barrier layer has a middle portion and a peripheral portion, and the middle portion is higher than the peripheral portion.

13. The fin field effect transistor (FinFET) device structure as claimed in claim 11, wherein the first fin structure is configured to form a p-type FinFET, and the second fin structure is configured to form an n-type FinFET.

14. The fin field effect transistor (FinFET) device structure as claimed in claim 11, wherein the epitaxial layer comprises silicon germanium (SiGe), germanium (Ge) or combinations thereof.

15. The fin field effect transistor (FinFET) device structure as claimed in claim 11, further comprising:
    an isolation structure formed on the substrate, wherein a top surface of the first APT region is below a top surface of the isolation structure.

16. The fin field effect transistor (FinFET) device structure as claimed in claim 11, wherein the barrier layer is epitaxially grown along a (111) plane.

17. The fin field effect transistor (FinFET) device structure as claimed in claim 11, further comprising:
    a gate dielectric layer formed on the epitaxial layer; and
    a gate electrode layer formed on the gate dielectric layer.

18. The fin field effect transistor (FinFET) device structure as claimed in claim 11, wherein the entire barrier layer is higher than a top surface of the first APT region.

19. A fin field effect transistor (FinFET) device structure, comprising:
    a first fin structure and a second fin structure extending from a substrate;

a first anti-punch through implant (APT) region formed in the first fin structure;
a barrier layer formed on the first APT region;
a second APT region formed over the second fin structure, wherein the barrier layer has a convex cross-sectional profile with two outer-most points which are higher than a bottom surface of the second APT region; and
an isolation structure formed over the substrate, wherein the first fin structure and the second fin structure are embedded in the isolation structure, wherein the first APT region is below a top surface of the isolation structure, and a portion of the second APT region is higher than the top surface of the isolation structure.

20. The fin field effect transistor (FinFET) device structure as claimed in claim 19, further comprising:
an epitaxial structure formed over the barrier layer, wherein a top surface of the second APT region is level with a top surface of the epitaxial structure.

* * * * *